(12) United States Patent
Woo et al.

(10) Patent No.: US 12,016,510 B2
(45) Date of Patent: Jun. 25, 2024

(54) DISHWASHER

(71) Applicant: LG Electronics Inc., Seoul (KR)

(72) Inventors: Sangwoo Woo, Seoul (KR); Kyungrae Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 303 days.

(21) Appl. No.: 17/431,804

(22) PCT Filed: Feb. 18, 2020

(86) PCT No.: PCT/KR2020/002276
§ 371 (c)(1),
(2) Date: Aug. 18, 2021

(87) PCT Pub. No.: WO2020/171526
PCT Pub. Date: Aug. 27, 2020

(65) Prior Publication Data
US 2022/0142453 A1    May 12, 2022

(30) Foreign Application Priority Data
Feb. 18, 2019   (KR) ................ 10-2019-0018559

(51) Int. Cl.
*A47L 15/42*    (2006.01)
*H05K 5/00*    (2006.01)
*H05K 5/06*    (2006.01)

(52) U.S. Cl.
CPC ......... *A47L 15/4293* (2013.01); *A47L 15/421* (2013.01); *H05K 5/0017* (2013.01); *H05K 5/065* (2013.01)

(58) Field of Classification Search
CPC . A47L 15/421; A47L 15/4293; H05K 5/0017; H05K 5/065
(Continued)

(56) References Cited

U.S. PATENT DOCUMENTS

2008/0273016 A1   11/2008  Helgesen
2012/0067383 A1    3/2012  Derr
2018/0333038 A1*  11/2018  Min ................ A47L 15/0034

FOREIGN PATENT DOCUMENTS

CN    106988083        7/2017
CN    107354673 A  *  11/2017  ............. D06F 33/02
(Continued)

OTHER PUBLICATIONS

JP2005052282A—Machine translation (Year: 2005).*
(Continued)

*Primary Examiner* — Tinsae B Ayalew
(74) *Attorney, Agent, or Firm* — Fish & Richardson P.C.

(57) ABSTRACT

A dishwasher includes a cabinet, a tub, a door, a control panel that is disposed in one side of the door and has an operation button, a printed circuit board that is disposed inside the control panel and detects an input for the operation button, a supporter that has a mounting space in which the printed circuit board is mounted and that is disposed inside the control panel, a waterproof film that is adhered to one side of the supporter facing the control panel and blocks water inflow into the printed circuit board disposed in the mounting space, and a coating layer filled with a waterproof material, in the mounting space of the supporter on which the printed circuit board is mounted.

12 Claims, 5 Drawing Sheets

(58) Field of Classification Search
USPC .......................................................... 134/57 D
See application file for complete search history.

(56) References Cited

FOREIGN PATENT DOCUMENTS

| | | |
|---|---|---|
| JP | S59154094 | 9/1984 |
| JP | S60072292 | 4/1985 |
| JP | H04121889 | 10/1992 |
| JP | H09149995 | 6/1997 |
| JP | 2005-052282 | 3/2005 |
| JP | 2005-118283 | 5/2005 |
| JP | 2008-006046 | 1/2008 |
| JP | 2010069192 | 4/2010 |
| KR | 10-2008-0051639 | 6/2008 |
| KR | 20130039457 | 4/2013 |
| KR | 20150081747 | 7/2015 |
| KR | 20170082406 | 7/2017 |

OTHER PUBLICATIONS

CN107354673A—Machine translation (Year: 2017).*
International Search Report in International Appln. No. PCT/KR2020/002276, dated Jun. 19, 2020.
Extended European Search Report in European Appln. No. 20759345.0, dated Oct. 28, 2022, 9 pages.
Office Action in Korean Appln. No. 10-2019-0018559, dated Sep. 20, 2023, 10 pages (with English translation).
Notice of Allowance in Korean Appln. No. 10-2019-0018559, mailed on Mar. 26, 2024, 6 pages (with English Translation).

* cited by examiner

DISHWASHER

CROSS-REFERENCE TO RELATED APPLICATIONS

This application is a National Stage application under 35 U.S.C. § 371 of International Application No. PCT/KR2020/002276, filed on Feb. 18, 2020, which claims the benefit of Korean Patent Application No. 10-2019-0018559, filed on Feb. 18, 2019. The disclosures of the prior applications are incorporated by reference in their entirety.

TECHNICAL FIELD

The present disclosure relates to a dishwasher, and more particularly, to a dishwasher including a control panel provided with an operation button on a door.

BACKGROUND ART

A dishwasher is a home appliance that washes contaminants such as food residues on dishes, cooking utensils, etc. (hereinafter, 'washing target') by high-pressure washing water sprayed from a spray arm.

A washing target may be loaded into or withdrawn from a tub through a door that opens and closes the tub. The dishwasher is provided with an operation button for operating the dishwasher and a printed circuit board for recognizing the operation of the dishwasher. User can control the operation of the dishwasher through those components. Meanwhile, the operation button and the printed circuit board may be disposed on a door which is disposed in the front that can be easily accessed by a user.

Meanwhile, high-temperature washing water or steam may flow inside the dishwasher, and the high-temperature washing water or steam may flow into the inside of the door or the upper side of the door during the flow process.

Accordingly, there is a very high possibility that moisture penetrates into an electric device such as a printed circuit board disposed on the door. When moisture penetrates the printed circuit board disposed to control the operation of the dishwasher, it may cause malfunction of a touch button due to conduction between internal circuits, conduction between buttons, corrosion of pattern, and the like.

Korean patent application KR 1020160072194 discloses a structure in which a PCB is disposed inside a control unit and discloses a PCB frame for fixing the PCB. However, since it does not disclose a structure of blocking moisture from entering the PCB, there still exists the above problem.

DISCLOSURE

Technical Problem

An object of the present disclosure is to provide a dishwasher that blocks the inflow of moisture to a printed circuit board disposed on a door.

Another object of the present disclosure is to provide a dishwasher that enhances the recognition power of an operation button by using a printed circuit board having a moisture inflow blocking structure.

The problems of the present disclosure are not limited to the problems mentioned above, and other problems not mentioned will be clearly understood by those skilled in the art from the following description.

Technical Solution

In order to achieve the above object, in the dishwasher according to the present disclosure, a control panel having an operation button is disposed in a door that opens and closes a tub at the front of the tub. A printed circuit board for detecting an input for an operation button is disposed inside the control panel, and the printed circuit board is mounted on a supporter for fixing the disposition of the printed circuit board inside the control panel. In the supporter on which the printed circuit board is mounted inside, a waterproof film is adhered to one side surface, and a coating layer filled with a waterproof material is formed in the mounting space where the printed circuit board is mounted, so that the inflow of moisture into the printed circuit board disposed inside the supporter can be completely blocked.

A button recognition part for detecting an input for the operation button is disposed in the printed circuit board, and a button hole formed to pass through between the button recognition part and the operation button is formed in the supporter.

The supporter includes a mounting plate which is disposed between the control panel and the printed circuit board, and has one side surface on which the printed circuit board is mounted; and an edge portion which is extended by bending from an edge area of the mounting plate in a direction in which the printed circuit board is disposed and forms an inner mounting space, so that the printed circuit board is mounted in the inner space formed by the mounting plate and the edge portion, and a mounting space filled with the coating layer may be formed.

The mounting plate includes an inner surface on which the printed circuit board is mounted and an outer surface disposed to face the control panel, and the waterproof film is adhered to the outer surface of the mounting surface, thereby blocking the moisture flowing in the direction of the outer surface of the mounting plate.

The waterproof film is adhered to the supporter by a film insert molding method, and the supporter and the waterproof film are formed of the same material, so that the waterproof film may be hermetically adhered to the supporter.

A lamp that is turned on or off when the input for the operation button is detected is disposed on the printed circuit board, and the supporter includes a lamp hole that is formed so that light generated in the lamp disposed on the printed circuit board is irradiated to the control panel.

The dishwasher further includes an input transmission portion which is disposed between the operation button and the button recognition part, and transmits user's input for the operation button to the button recognition part, and the input transmission portion includes: a first input transmission portion disposed between the waterproof film and the printed circuit board; and a second input transmission portion disposed between the waterproof film and the control panel, so that an input to the operation button spaced apart from the button recognition unit with the supporter interposed therebetween may be transmitted to the button recognition unit.

A thickness of the first input transmission portion is greater than a thickness of the second input transmission portion, thereby narrowing a gap between the supporter and the control panel and securing the thickness for strengthening the supporter.

The waterproof film includes a first printing part that is carbon-printed in a portion that the input transmission member contacts, so that input transmission can be achieved well even for the waterproof film disposed between the operation button and the button recognition unit.

The waterproof film includes a second printing part that is diffusely printed so as to uniformly radiate a light irradiated from the lamp in a portion facing the lamp hole, so that light irradiated from the lamp can be uniformly emitted to the outside of the control panel.

The printed circuit board includes a first surface mounted on the supporter and a second surface exposed to the mounting space of the supporter, and in the supporter, the waterproof film is adhered to an outer surface of the supporter disposed in a direction in which the first surface faces, and the coating layer is formed in the mounting space of the supporter in a direction in which the second surface faces, so that a waterproof film and a coating layer may be formed on both sides of the supporter on which the printed circuit board is disposed.

The details of other embodiments are included in the detailed description and drawings.

Advantageous Effects

According to the dishwasher of the present disclosure, there are one or more of the following effects.

First, a printed circuit board disposed inside the control panel is disposed inside the supporter, and in the supporter, a waterproof film is adhered to one side, and a coating layer filled with a waterproof material is disposed in the other side, thereby blocking moisture flowing into the printed circuit board. This prevents corrosion or defects of the printed circuit board from occurring, thereby maximizing the service life of the control panel on which the printed circuit board is disposed.

Second, the input transmission member is disposed in the front and rear area where the waterproof film is disposed, and the recognition power of the operation button is increased through carbon printing for the waterproof film on which the input transmission member is disposed, thereby enabling easy operation by a user.

The effects of the present disclosure are not limited to the above-mentioned effects, and other effects not mentioned will be clearly understood by those skilled in the art from the description of the claims.

MODE FOR INVENTION

Figure 1:
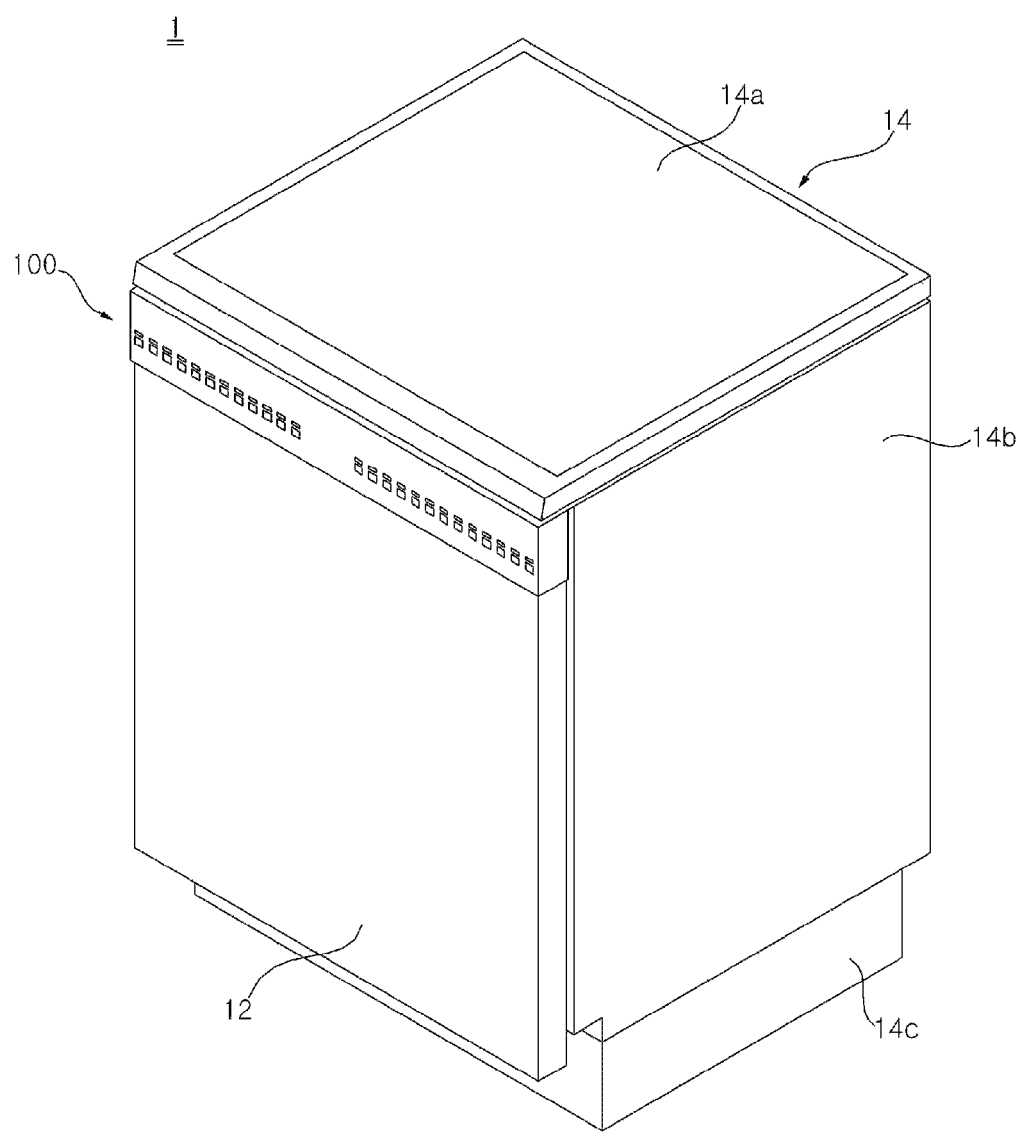
FIG. 1 is a perspective view of a dishwasher according to an embodiment of the present disclosure.

Advantages and features of the present invention and methods of achieving them will become apparent with reference to the embodiments described below in detail in conjunction with the accompanying drawings. However, the present invention is not limited to the embodiments disclosed below, but may be implemented in various different forms, and these embodiments are provided only to allow the disclosure of the present invention to be complete, and to completely inform those of ordinary skill in the art to which the present invention belongs, the scope of the invention, and the present invention is only defined by the scope of the claims. Like reference numerals refer to like elements throughout.

Hereinafter, the present disclosure will be described with reference to the drawings for explaining a dishwasher according to embodiments of the present disclosure.

<Overall Configuration>

Figure 2:
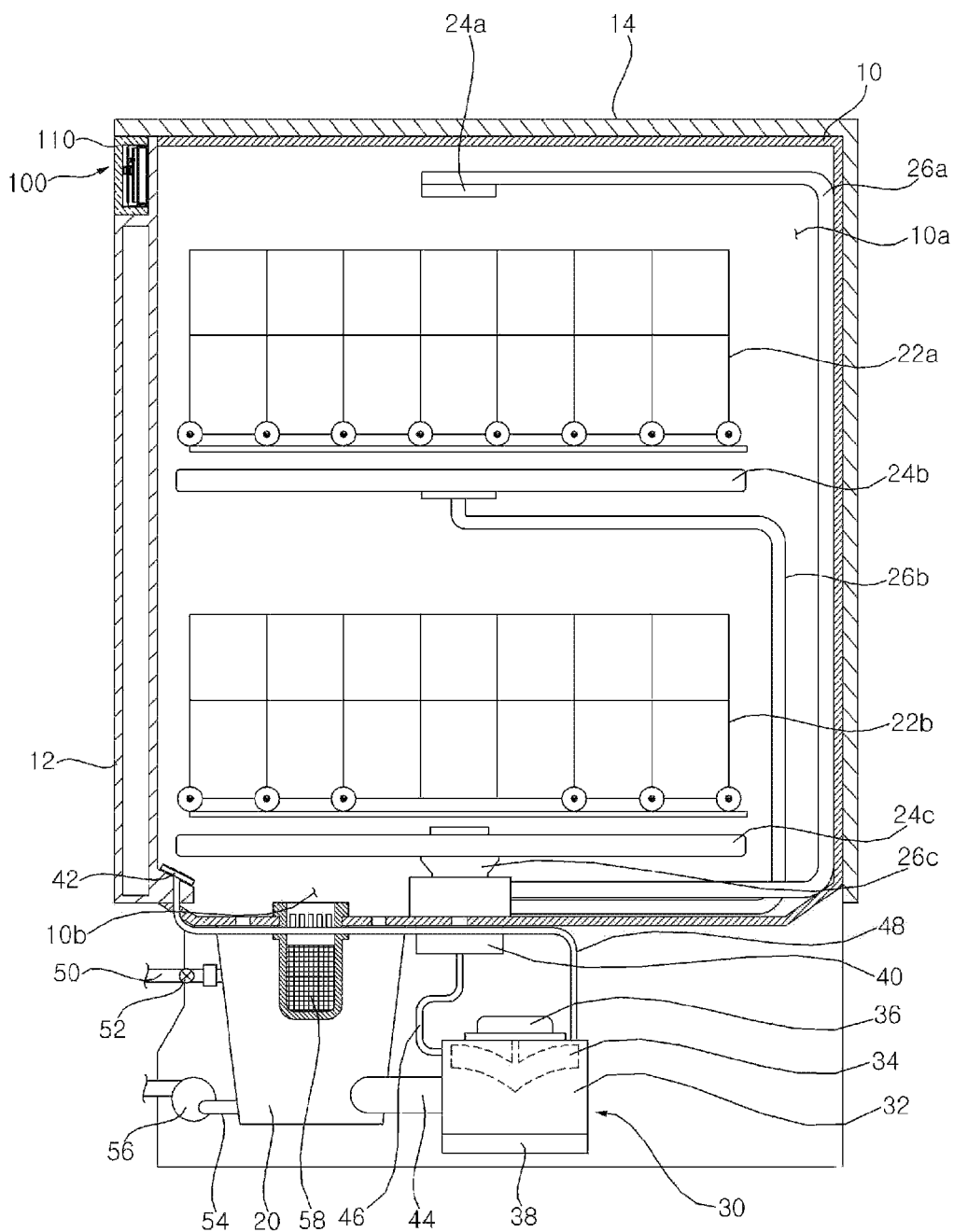
FIG. 2 is a schematic cross-sectional view for explaining a configuration of a dishwasher according to an embodiment of the present disclosure.
Figure 3:
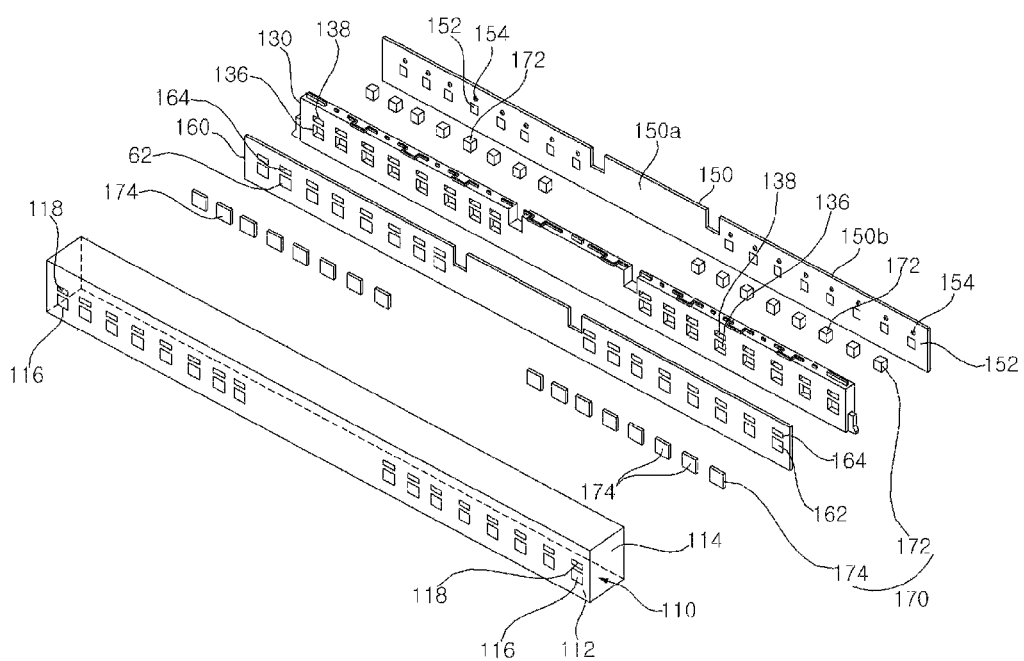
FIG. 3 is an exploded view of a control module according to an embodiment of the present disclosure.
Figure 4:
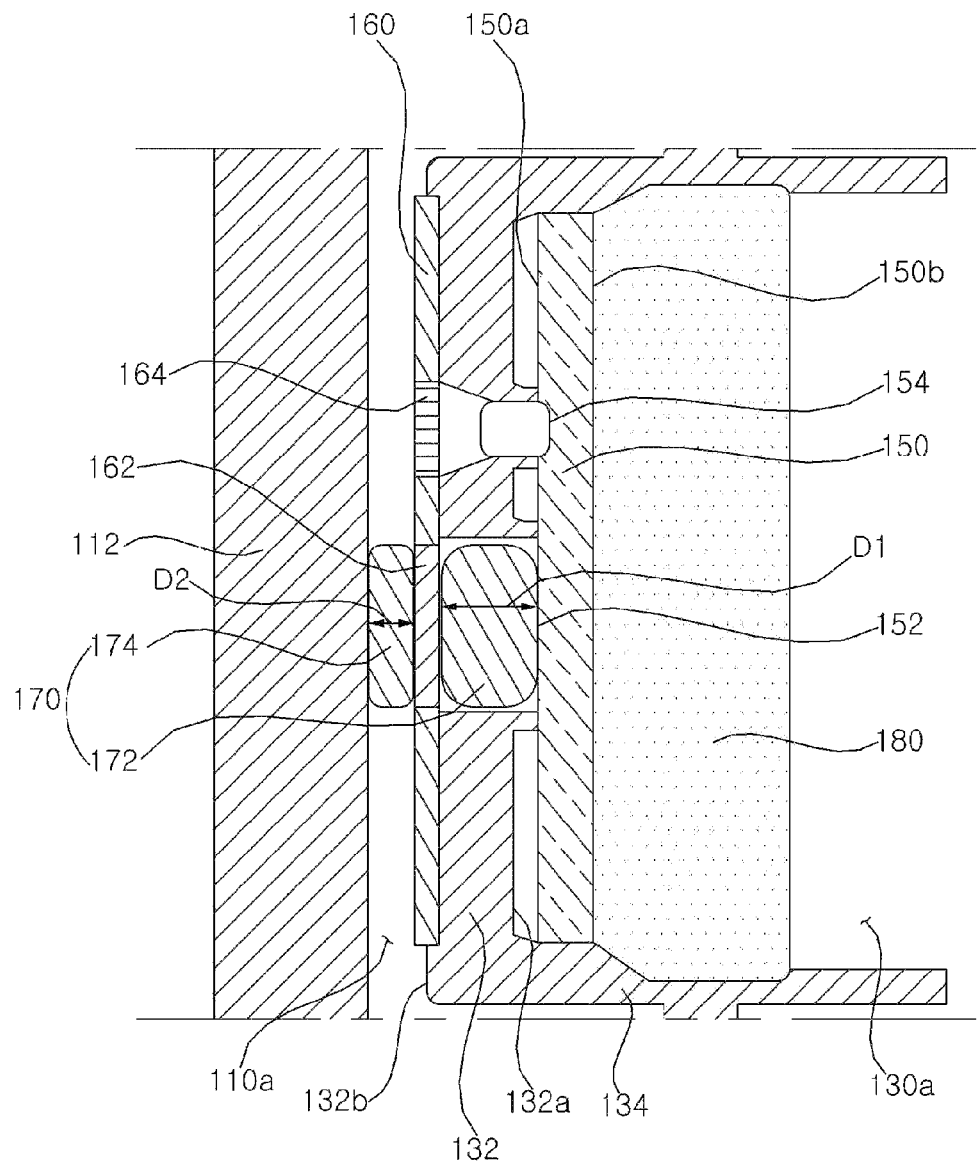
FIG. 4 is a cross-sectional view of the control module according to an embodiment of the present disclosure.
Figure 5A:
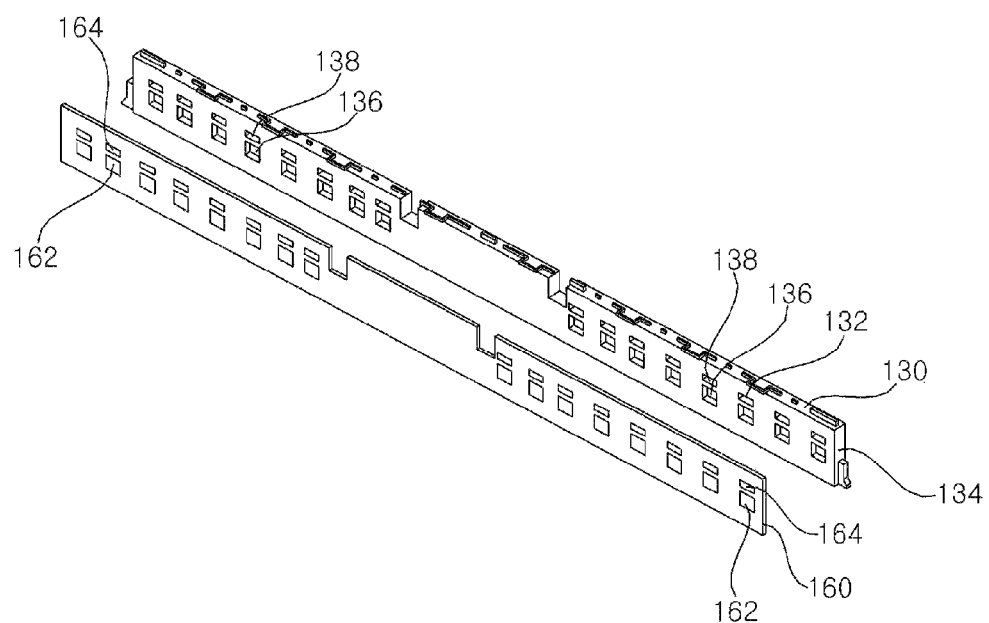
FIG. 5A is a state diagram before adhesion of a supporter and a waterproof film according to an embodiment of the present disclosure.
Figure 5B:
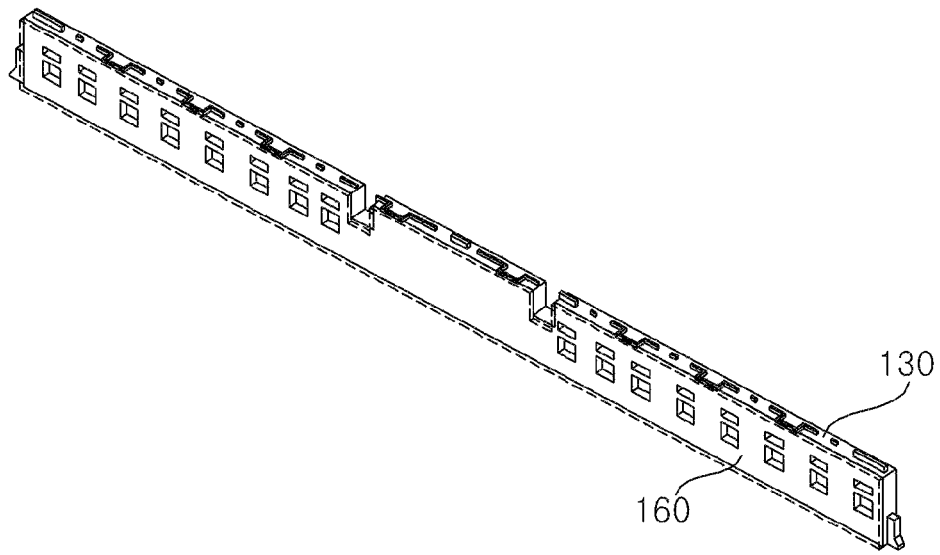
FIG. 5B is a state diagram after adhesion of the supporter and the waterproof film according to an embodiment of the present disclosure.

Hereinafter, the overall configuration of a dishwasher 1 according to the present embodiment will be briefly described with reference to FIGS. 1 to 2.

The dishwasher 1 according to the present embodiment includes a cabinet 14 forming an outer shape, a tub 10 which is disposed inside the cabinet 14, has a washing chamber 10*a* formed therein, and has an opened front surface, a sump 20 which is disposed in a lower side of the tub 10, is disposed in a lower side of the tub 10, and temporarily stores washing water supplied to the tub 10, a door 12 which is rotatably connected to the tub 10 at the lower end of the tub 10, and opens and closes the opened front surface of the tub 10, and a control module 100 which is disposed in one side of the door 12, and has an operation button 116.

The dishwasher 1 according to the present embodiment may further include a rack 22*a*, 22*b* which is disposed inside the washing chamber 10*a*, and mounts dishes that is a washing target, a plurality of spray nozzles 24*a*, 24*b*, 24*c* for spraying washing water to the washing chamber 10*a*, a washing pump 30 which is disposed in the lower side of the tub 10 and pumps the washing water stored in the sump 20 to the plurality of spray nozzles 24*a*, 24*b*, 24*c*, a switching valve 40 for sending the washing water pumped from the washing pump 30 to at least one of the plurality of spray nozzles 24*a*, 24*b*, 24*c*, and a plurality of connection pipes 26*a*, 26*b*, 26*c* for connecting the switching valve 40 and the plurality of spray nozzles 24*a*, 24*b*, 24*c*, respectively The washing pump 30 may rotate an impeller 34 disposed inside a washing pump housing 32 by using a washing motor 36, and supply washing water stored in the sump 20 to the tub 10. The washing pump 30 may further include a heater 38 for heating the washing water existing inside the washing pump housing 32. The heater 38 may generate steam by heating the washing water inside the washing pump 30.

The dishwasher 1 according to the present embodiment may further include a steam nozzle 42 for sending the steam generated by the heater 38 into the tub 10. The dishwasher 1 according to the present embodiment may include a washing pump inlet pipe 44 connecting the sump 20 and the washing pump 30, a washing pump discharge pipe 46 connecting the washing pump 30 and the switching valve 40, and a steam discharge pipe 48 connecting the washing pump 30 and the steam nozzle 42.

A filter 58 for filtering foreign substances from the washing water introduced from the tub 10 may be disposed in the sump 20. The dishwasher 1 according to the present embodiment may include a water supply pipe 50 for supplying washing water to the sump 20, a water supply valve 52 for opening and closing the water supply pipe 50, and a drain pipe 54 and a drain pump 56 for discharging the washing water of the sump 20 to the outside.

The tub 10 may have a box shape having an open front surface. The tub 10 may be connected to the sump 20 downwardly. The tub 10 may have a sump hole 10*b* connected to the sump 20 downwardly. A plurality of racks 22*a* and 22*b* may be disposed in the washing chamber 10*a* formed inside the tub 10.

A plurality of spray nozzles 24a, 24b, and 24c are disposed in the washing chamber 10a formed inside the tub 10. The plurality of spray nozzles 24a, 24b, 24c may spray the washing water toward the inner surface of the rack 22a, 22b or the tub 10.

The tub 10 is rotatably connected to the door 12 at the front lower end. The tub 10 may be hinge-connected to the door 12.

The cabinet 14 may include a top cover 14a covering the upper side of the tub 10, a circumferential surface cover 14b that covers the side and rear surfaces of the tub 10, and a base 14c which is disposed in the lower side of the tub 10, and forms a space in which the sump 20 and the like are disposed.

The base 14c is disposed in the lower side of the tub 10, and supports the tub 10. The base 14c is a support means for separating the tub 10 from the floor by a predetermined distance, and may form a space in which the sump 20 and the washing pump 30 are disposed.

<Control Module>

The control module 100 according to the present embodiment may receive user's command for operating the dishwasher 1. The control module 100 may receive user's command through the operation button 116. The user may command the operation of the dishwasher 1 by pressing the operation button 116.

The control module 100 according to the present embodiment includes a printed circuit board 150 equipped with a button recognition part 152 for detecting an input to the operation button 116, a control panel 110 that forms an outer shape and forms a space in which the printed circuit board 150 is disposed, a supporter 130 which is disposed inside the control panel 110, and has the printed circuit board 150 mounted therein, and a waterproof film 160 which is disposed in one side of the supporter 130 to block moisture flowing into the supporter 130 in which the printed circuit board 150 is mounted.

The control module 100 according to the present embodiment may further include an input transmission member 170 that transmits user's input for the operation button 116 to the button recognition part 152.

The control panel 110 is disposed in one side of the door 12, and includes an operation button 116. The control panel 110 according to the present embodiment is disposed in the upper side of the door 12. The control panel 110 may be configured integrally with the door 12 or may be separately configured. Referring to FIG. //, the control panel 110 according to the present embodiment is configured separately from the door 12, and is disposed to be coupled to the door at the upper portion of the door 12.

The control panel 110 according to the present embodiment has a receiving space 110a, which is formed therein, in which the printed circuit board 150 and the supporter 130 are disposed, and includes a button-formed surface cover 112 on which the operation button 116 is disposed, and a circumferential surface cover 114 formed by bending from the circumference of the button-formed surface cover 112. The receiving space 110a is formed between the button-formed surface cover 112 and the circumferential surface cover 114. The rear of the control panel 110 may be coupled to a structure of the door 12.

The button-formed surface cover 112 may be provided with an operation button 116 for detecting user's input signal. A plurality of operation buttons 116 may be formed in the control panel 110 according to the present embodiment.

The operation button 116 according to the present embodiment may have a structure that can be pressed by a user by forming a concave groove or protruding in a convex shape so that the user can check a button area. The control module 100 according to the present embodiment may use a capacitive touch button. Accordingly, on the button-formed surface cover 112 of the control panel 110, a concave groove for checking the button area may be formed, or an operation button 116 having a shape indicating the button area may be disposed.

The control panel 110 according to the present embodiment may include a lamp display area 118 that externally indicates a state in which a lamp 154 described below is turned on. The lamp display area 118 may be formed of a transparent material so that a state in which the lamp 154 disposed inside the control panel 110 is turned on can be recognized from the outside. Accordingly, the lamp display area 118 may not be displayed in a separate form on the control panel 110.

The control panel 110 according to the present embodiment has a structure in which the button-formed surface cover 112 on which the operation button 116 is disposed is disposed to face forward. However, this is just an embodiment, and it is also possible to have a structure in which the button-formed surface cover 112 is formed to face the upper surface.

A fastening portion (not shown) to which the supporter 130 is fixed may be formed inside the control panel 110. The supporter 130 is fixedly disposed in the receiving space 110a. The supporter 130 is mounted in the control panel 110 at the inside of the control panel 110.

The printed circuit board 150 is fixedly disposed inside the control panel 110, and may recognize a command input by a user through the operation button 116 of the control panel 110. That is, it is possible to recognize the operation button 116 that the user presses for a command.

A button recognition part 152 for detecting an input of the operation button 116 formed on the control panel 110 may be disposed on the printed circuit board 150 according to the present embodiment. The button recognition part 152 according to the present embodiment may be a touch sensor that detects user's input in a capacitive manner. A plurality of button recognition parts 152 corresponding to the plurality of operation buttons 116 may be disposed on the printed circuit board 150 according to the present embodiment.

A lamp 154 that is turned on/off in response to a button recognized by the button recognition part 152 may be disposed on the printed circuit board 150 according to the present embodiment. A plurality of lamps 154 corresponding to the plurality of button recognition parts 152 may be disposed on the printed circuit board 150 according to the present embodiment. The plurality of button recognition parts 152 and the plurality of lamps 154 may be disposed in pairs, respectively. The button recognition part 152 and the lamp 154 that form each pair may be electrically connected. Accordingly, when any one of the plurality of button recognition parts 152 detects user's input, the lamp 154 corresponding to each pair may be turned on or off.

The lamp 154 according to the present embodiment may use a chip light-emitting diode (LED). The control panel 110 according to the present embodiment has a structure disposed in the upper side of the door 12. Therefore, the structure of the printed circuit board 150, the button recognition part 152, and the lamp 154 must be disposed in a limited range in which the door 12 forms a thickness, so that a chip LED having a small space limitation can be used.

The printed circuit board 150 is formed to have both surfaces, and the button recognition part 152 and the lamp 154 are disposed on a first surface 150a. Various circuit devices (not shown) may be mounted on a second surface 150b of the printed circuit board 150. In the printed circuit board 150, the first surface 150a on which the button recognition part 152 is disposed is mounted on an inner surface 132a of the supporter 130. When the printed circuit board 150 is mounted in the supporter 130, the second surface 150b of the printed circuit board 150 may be exposed to a mounting space 130a of the supporter 130.

The supporter 130 fixes the disposition of the printed circuit board 150 disposed inside the control panel 110 and prevents moisture from flowing into the printed circuit board 150.

The supporter 130 according to the present embodiment has a structure surrounding one side of the printed circuit board 150. The supporter 130 according to the present embodiment forms a mounting space 130a, which is formed therein, in which the printed circuit board 150 is mounted.

The supporter 130 includes a mounting plate 132 on which the printed circuit board 150 is mounted, and an edge portion 134 extended by bending from an edge area of the mounting plate 132 in the direction in which the printed circuit board 150 is disposed.

A plurality of buttonholes 136 may be formed in the mounting plate 132 of the supporter 130. The plurality of buttonholes 136 are formed in a position corresponding to each of the plurality of button recognition parts 152 disposed on the printed circuit board 150 mounted on the mounting plate 132.

The mounting plate 132 of the supporter 130 includes a lamp hole 138 which is formed such that light generated from the lamp 154 is irradiated to the control panel 110. A plurality of lamp holes 138 may be formed in the mounting plate 132 of the supporter 130. The plurality of lamp holes 138 are formed in a position corresponding to each of the plurality of lamps 154 disposed on the printed circuit board 150 mounted on the mounting plate 132.

The mounting plate 132 may include an inner surface 132a on which the printed circuit board 150 is disposed, and an outer surface 132b disposed to face the control panel 110. A waterproof film 160 is disposed on an outer surface 132b of the mounting plate 132. The waterproof film 160 is adhered to the outer surface 132b of the mounting plate 132 so as to prevent the moisture of the outside of the supporter 130 from flowing into the mounting space 130a through the button hole 136 or the lamp hole 138 formed in the mounting plate 132.

The waterproof film 160 may be adhered to the supporter 130 by a film insert molding method. The film insert molding method may be a method in which a waterproof film 160 thermoformed to fit the outer surface 132b of the mounting plate 132 of the supporter 130 is placed in a mold, and the supporter 130 is injected. In this case, the adhesive force between the waterproof film 160 and the supporter 130 may be increased by using the same material for the waterproof film 160 and the supporter 130. As an embodiment, the supporter 130 and the waterproof film 160 may use a polycarbonate material.

The waterproof film 160 may be adhered to the supporter 130 by a welding method.

The waterproof film 160 may include a first printing part 162 that is carbon-printed in a portion where the buttonhole 136 is formed. The first printing part 162 is a carbon printed area on the surface of the waterproof film 160, and easily causes a conduction of static electricity generated in a first input transmission member 172 and a second input transmission member 174.

The waterproof film 160 includes a second printing part 164 that is translucently printed or diffusely printed in a portion where the lamp hole 138 is formed. The second printing part 164 may be translucently printed or diffusely printed on the surface of the waterproof film 160 so that light generated by the lamp 154 may be uniformly emitted.

The input transmission member 170 according to the present embodiment is disposed between the operation button 116 and the button recognition part 152, and may transmit the user's input for the operation button 116 to the button recognition part 152. The input transmission member 170 according to the present embodiment may use a touch gasket formed with a sponge-type. Accordingly, static electricity generated in the operation button 116 may be smoothly transmitted to the button recognition part 152 by the input transmission member 170. As another embodiment, in the operation button and the button recognition part using a pressing method, a structure where the input transmission part transmits the force pressed by the operation button to the button recognition part may be formed.

The input transmission member 170 according to the present embodiment includes a first input transmission member 172 disposed between the waterproof film 160 and the printed circuit board 150, and a second input transmission member 174 disposed between the waterproof film 160 and the control panel 110. The input transmission member 170 according to the present embodiment includes a plurality of first input transmission members 172 corresponding to the plurality of button recognition parts 152, and a plurality of second input transmission members 174 corresponding to the plurality of operation buttons 116.

The first input transmission member 172 is disposed on the first surface 150a of the printed circuit board 150. The first input transmission member 172 may be adhered to the waterproof film 160. The first input transmission member 172 is disposed in the button hole 136 formed in the supporter 130. The first input transmission member 172 may be in contact with the waterproof film 160 at one side, and be in contact with the button recognition part 152 of the printed circuit board 150 at the other side. The first printing part 162 may be disposed in the waterproof film 160 at a portion in contact with the first input transmission member 172.

The second input transmission member 174 is disposed on the inner surface of the control panel 110. The second input transmission member 174 may be adhered to the waterproof film 160. That is, to the waterproof film 160, the first input transmission member 172 may be adhered at the surface facing the printed circuit board 150, and the second input transmission member 174 may be adhered at the surface facing the control panel 110. The first printing part 162 may be disposed on the surface of the waterproof film 160 to which the first input transmission member 172 and the second input transmission member 174 are adhered.

The second input transmission member 174 may be in contact with the waterproof film 160 at one side, and in contact with the inner surface on which the operation button 116 of the control panel 110 is formed at the other side.

A thickness D1 of the first input transmission member 172 may be greater than a thickness D2 of the second input transmission member 174. The thickness D1 of the first input transmission member 172 may be three times or more greater than the thickness D2 of the second input transmission member 174. A gap between the printed circuit board 150 and the control panel 110 may be narrowed by minimizing the range of the thickness D2 of the second input transmission member 174. However, in order to reinforce the strength of the supporter 130, the thickness of the first input transmission member 172 may be thicker than that of the second input transmission member 174 in consideration of the thickness of the supporter 130.

A coating layer 180 made of a waterproof material is formed in the mounting space 130a of the supporter 130. The inner surface 132a of the supporter 130 is filled with a waterproof material in the direction of the second surface 150b of the printed circuit board 150 to form the coating layer 180. That is, in the state in which the printed circuit board 150 is mounted, the coating layer 180 may be formed in the direction of the second surface 150b of the printed circuit board 150 by injecting a waterproofing material into the mounting space 130a of the supporter 130. The waterproof material according to the present embodiment may use silicone or urethane.

Accordingly, in the printed circuit board 150 mounted on the supporter 130, the waterproof film 160 is adhered to the outer surface of the supporter 130 in the direction in which the first surface 150a faces, and the coating layer 180 filled with a waterproof material is formed in the direction in which the second surface 150b faces, so that the inflow of moisture into the printed circuit board 150 mounted on the supporter 130 can be blocked.

The waterproof material is coated so that the printed circuit board 150 mounted on the inner surface 132a of the supporter 130 is all covered, thereby blocking the inflow of moisture into the printed circuit board 150. The coating layer 180 may be formed with a thickness that covers all of the second surface 150b of the printed circuit board 150 in the mounting space 130a of the supporter 130.

Although the present disclosure has been described with reference to specific embodiments shown in the drawings, it is apparent to those skilled in the art that the present description is not limited to those exemplary embodiments and is embodied in many forms without departing from the scope of the present disclosure, which is described in the following claims. These modifications should not be individually understood from the technical spirit or scope of the present disclosure.

What is claimed is:

1. A dishwasher comprising:
   a cabinet that defines an outer shape of the dishwasher;
   a tub that is disposed inside the cabinet and that defines a washing chamber configured to accommodate a washing target, the tub having an open front;
   a door that is configured to open and close the opened front of the tub;
   a control panel that is disposed in one side of the door and that has an operation button;
   a printed circuit board that is disposed inside the control panel and that is configured to detect an input for the operation button;
   a supporter that defines a mounting space therein, wherein the printed circuit board is mounted in the mounting space, and the supporter is disposed inside the control panel;
   a waterproof film that is adhered to one side of the supporter facing the control panel and that is configured to block water inflow into the printed circuit board disposed in the mounting space; and
   a coating layer filled with a waterproof material, the coating layer being disposed in the mounting space of the supporter on which the printed circuit board is mounted,
   wherein the printed circuit board comprises a first surface mounted on the supporter and a second surface exposed to the mounting space of the supporter, and
   wherein the waterproof film is adhered to an outer surface of the supporter disposed in a direction in which the first surface faces, and the coating layer is disposed in the mounting space of the supporter in a direction in which the second surface faces.

2. The dishwasher of claim 1, wherein the supporter comprises:
   a mounting plate that is disposed between the control panel and the printed circuit board, and has one side surface on which the printed circuit board is mounted; and
   an edge portion that is extended by bending from an edge area of the mounting plate in a direction in which the printed circuit board is disposed and forms an inner mounting space.

3. The dishwasher of claim 2, wherein the mounting plate comprises an inner surface on which the printed circuit board is mounted and an outer surface disposed to face the control panel, and
   wherein the waterproof film is adhered to the outer surface of the mounting plate.

4. The dishwasher of claim 1, wherein the waterproof film is adhered to the supporter by a film insert molding method.

5. The dishwasher of claim 4, wherein the supporter and the waterproof film are formed of the same material.

6. The dishwasher of claim 1, further comprising a lamp that is configured to be turned on or off based on the input for the operation button, the lamp being is disposed on the printed circuit board,
   wherein the supporter defines a lamp hole that allows light generated in the lamp disposed on the printed circuit board to be irradiated to the control panel.

7. The dishwasher of claim 6, wherein the waterproof film comprises a second printing part that is diffusely printed and configured to uniformly radiate light irradiated from the lamp in a portion facing the lamp hole.

8. A dishwasher comprising:
   a cabinet that defines an outer shape of the dishwasher;
   a tub that is disposed inside the cabinet and that defines a washing chamber configured to receive a washing target, the tub having an open front;
   a door that is configured to open and close the opened front of the tub;
   a control panel that is disposed in one side of the door and that has an operation button;
   a printed circuit board that is disposed inside the control panel and that is configured to detect an input for the operation button;
   a supporter that defines a mounting space therein, wherein the printed circuit board is mounted in the mounting space, and the supporter is disposed inside the control panel;
   a waterproof film that is adhered to one side of the supporter facing the control panel and that is configured to block water inflow into the printed circuit board disposed in the mounting space; and
   a coating layer filled with a waterproof material, the coating layer being disposed in the mounting space of the supporter on which the printed circuit board is mounted, wherein the printed circuit board comprises a button recognition part for detecting an input for the operation button, and wherein the supporter defines a button hole that passes through the supporter and that is disposed between the button recognition part and the operation button.

9. The dishwasher of claim 8, further comprising an input transmission portion that is disposed between the operation button and the button recognition part and that is configured to transmit the input for the operation button to the button recognition part.

10. The dishwasher of claim 9, wherein the input transmission portion comprises:

a first input transmission portion disposed between the waterproof film and the printed circuit board; and a second input transmission portion disposed between the waterproof film and the control panel.

11. The dishwasher of claim 10, wherein a thickness of the first input transmission portion is greater than a thickness of the second input transmission portion.

12. The dishwasher of claim 9, wherein the waterproof film comprises a first printing part that is carbon-printed in a portion that the input transmission portion contacts.

\* \* \* \* \*